(12) United States Patent
Rappoport (10) Patent No.: US 9,179,537 B2
(45) Date of Patent: Nov. 3, 2015

(54) METHODS FOR FORMING METALLIZED DIELECTRIC STRUCTURES

(71) Applicant: Apple Inc., Cupertino, CA (US)

(72) Inventor: Benjamin M. Rappoport, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 239 days.

(21) Appl. No.: 13/714,186

(22) Filed: Dec. 13, 2012

(65) Prior Publication Data

US 2014/0166350 A1    Jun. 19, 2014

(51) Int. Cl.
| | |
|---|---|
| *H01L 21/00* | (2006.01) |
| *H05K 1/02* | (2006.01) |
| *H01Q 1/38* | (2006.01) |
| *H05K 3/28* | (2006.01) |

(52) U.S. Cl.
CPC .............. *H05K 1/0216* (2013.01); *H01Q 1/38* (2013.01); *H05K 1/0243* (2013.01); *H05K 3/284* (2013.01); *Y10T 29/49016* (2015.01); *Y10T 156/1028* (2015.01)

(58) Field of Classification Search
CPC ....... H05K 1/18; H05K 1/181; H05K 1/0216; H05K 1/0243; H05K 3/284; H01Q 1/38; Y10T 29/49016; Y10T 156/1028
USPC .................................... 29/830, 832, 840, 852
See application file for complete search history.

(56) References Cited

U.S. PATENT DOCUMENTS

| | | | |
|---|---|---|---|
| 6,625,028 B1 * | 9/2003 | Dove et al. ..................... 361/707 |
| 7,488,901 B2 | 2/2009 | Arnold | |
| 7,955,464 B2 | 6/2011 | Holmberg | |
| 2009/0266602 A1 | 10/2009 | Tseng | |
| 2012/0223865 A1 | 9/2012 | Li et al. | |
| 2014/0146501 A1 * | 5/2014 | Thiel et al. .................... 361/762 |

FOREIGN PATENT DOCUMENTS

| | | |
|---|---|---|
| JP | 11208168 A * | 8/1999 |
| WO | 2012018595 | 2/2012 |
| WO | 2012/054960 A1 * | 5/2012 |

OTHER PUBLICATIONS

"Kuraray LCP Film," Kuraray Co., Ltd., Japan, May 2012 (2 pages) [Retrieved on Dec. 13, 2012]. Retrieved from the Internet <URL: http://www.kuraray.co.jp/en/products/medical/pdf/vecstar_catalog.pdf>.
Just et al., U.S. Appl. No. 12/968,065, filed Dec. 14, 2010.

\* cited by examiner

*Primary Examiner* — Carl Arbes
(74) *Attorney, Agent, or Firm* — Treyz Law Group; G. Victor Treyz; Joseph F. Guihan (57) ABSTRACT

An electronic device may be provided with metal coated dielectric structures that serve as electromagnetic interference shielding, antenna structures, or other metal structures. The metal coated dielectric structures may be formed form a sheet of polymer. Metal may be deposited on the sheet of polymer using a deposition tool and patterned following deposition or may be patterned during deposition. A dielectric sheet having patterned metal may be shaped into a desired shape using molding equipment or other equipment that applies heat and pressure to the dielectric sheet and patterned metal. Metal on a dielectric sheet may also be patterned after the dielectric sheet is formed into a desired shape. Metal may be formed on opposing sides of the dielectric sheet.

17 Claims, 11 Drawing Sheets

METHODS FOR FORMING METALLIZED DIELECTRIC STRUCTURES

BACKGROUND

This relates to electronic devices and, more particularly, to dielectric substrates with metal coatings for forming components in electronic devices.

Electronic devices such as cellular telephones and other portable devices are often provided with radio-frequency circuitry and other components. Such circuitry often requires electromagnetic interference shielding or is coupled to antenna structures. In an antenna, patterned metal traces may be formed on a dielectric substrate such as a polymer substrate. Metal shielding cans may be used to enclose and electromagnetically shield radio-frequency integrated circuits.

It can be challenging to form metal structures such as shielding cans and antennas for use in electronic devices. In some situations, the amount of space within an electronic device is limited, making it difficult or impossible to use conventionally designed structures.

It would therefore be desirable to be able to provide improved metal structures for an electronic device such as improved shielding structures and antenna structures.

SUMMARY

An electronic device may be provided with metal coated dielectric structures that serve as electromagnetic interference shielding, antenna structures, or other metal structures.

The metal coated dielectric structures may be formed from a polymer such as a polyimide, polyethylene terephthalate (PET), liquid crystal polymer, or other dielectric materials. The dielectric may be provided as a thin layer of material such as a thin polymer sheet.

Metal may be deposited on the sheet of polymer using a deposition tool and patterned following deposition. Metal may also be patterned during deposition using a shadow mask, pad printing equipment, screen printing equipment, or other metal deposition tools. A dielectric sheet having patterned metal may be shaped into a desired shape using molding equipment or other equipment that applies heat and pressure to the dielectric sheet and patterned metal. Metal on a dielectric sheet may also be patterned after the dielectric sheet is formed into a desired shape.

Metal coated plastic parts may be lighter than comparable sheet metal parts, thereby allowing weight in an electronic device to be minimized. The use of additional insulating layers of the type that are sometimes used on the underside of sheet metal shielding cans to ensure electrical isolation between shielded components and the shielding cans may also be reduced or eliminated by forming shielding structures from metal coated plastic parts.

If desired, metal may be formed on multiple sides of a polymer sheet. The metal may be used in forming shielding structures, antenna structures, a combination of shielding structures and antenna structures, or other patterned metal structures.

Further features of the invention, its nature and various advantages will be more apparent from the accompanying drawings and the following detailed description of the preferred embodiments.

DETAILED DESCRIPTION

Figure 1:
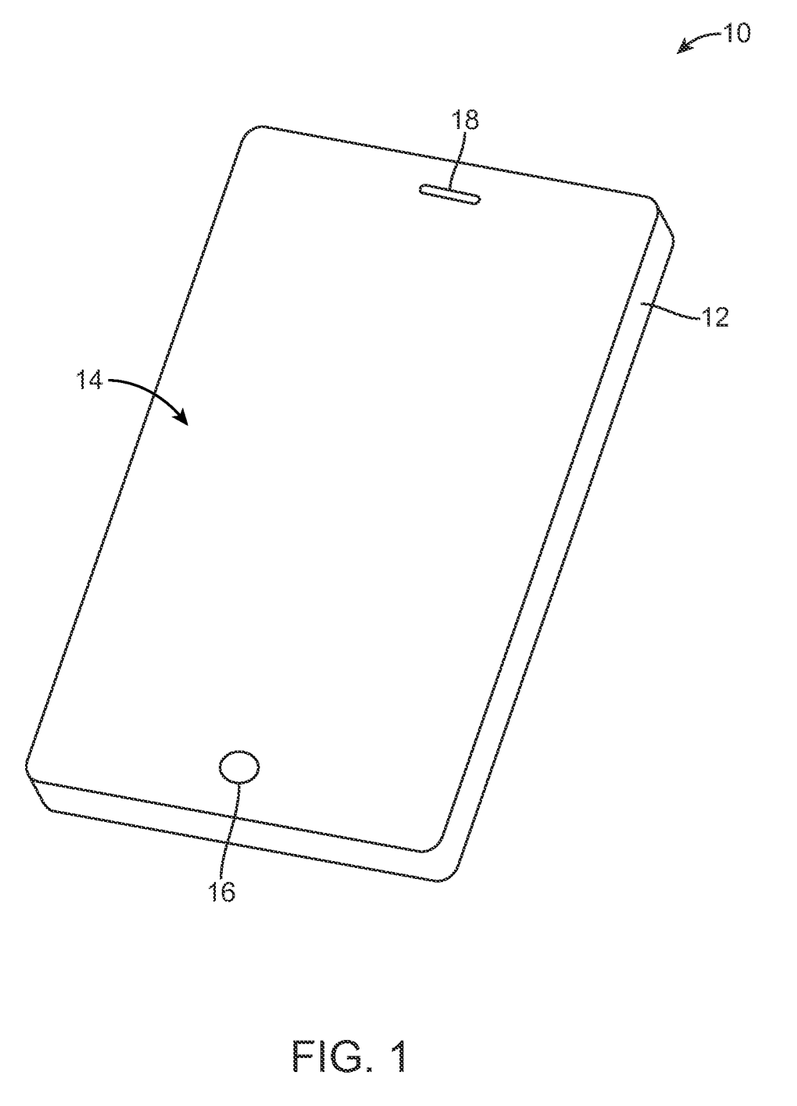
FIG. 1 is a front perspective view of an illustrative electronic device in accordance with an embodiment of the present invention.

Dielectrics covered with metal may be used to form electromagnetic interference shielding structures, antenna structures, and other structures in an electronic device. An illustrative electronic device of the type that may be provided with structures such as these is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, or other electronic equipment.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of electrowetting display pixels, or display pixels based on other display technologies. Configurations in which display 14 includes display layers that form liquid crystal display (LCD) pixels may sometimes be described herein as an example. This is, however, merely illustrative. Display 14 may include display pixels formed using any suitable type of display technology.

Display 14 may be protected using a display cover layer such as a layer of transparent glass or clear plastic. Openings may be formed in the display cover layer. For example, an opening may be formed in the display cover layer to accommodate a button such as button 16 and an opening such as opening 18 may be used to form a speaker port. Device configurations without openings in display 14 may also be used for device 10.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

Figure 2:
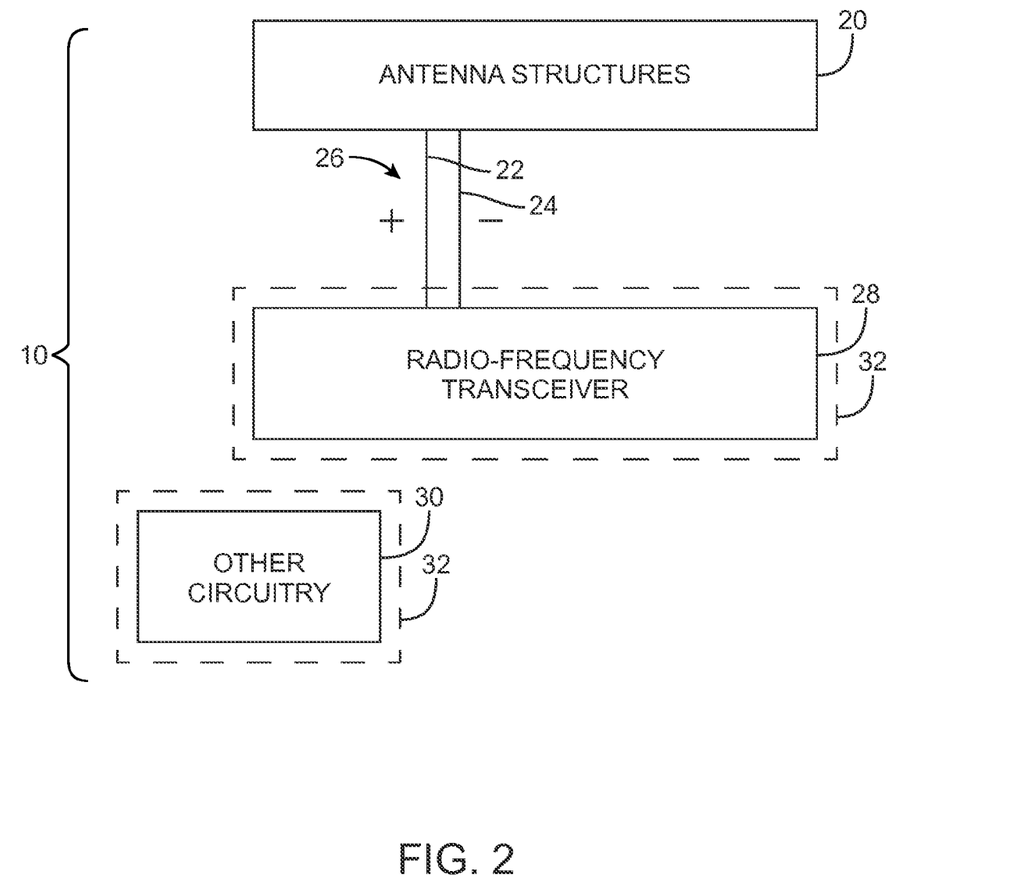
FIG. 2 is a schematic diagram of illustrative antenna circuitry and radio-frequency transceiver circuitry in accordance with an embodiment of the present invention.

FIG. 2 is a diagram of illustrative circuitry of the type that may be included in electronic devices such as electronic device 10 of FIG. 1. As shown in FIG. 2, device 10 may include antenna structures 20. Antenna structures 20 may include antennas such as inverted-F antennas, planar inverted-F antennas, loop antennas, patch antennas, slot antennas, dipole antennas, monopole antennas, other suitable antennas, or antennas formed from multiple antenna structures of these types.

Antenna structures 20 may be coupled to radio-frequency transceiver circuitry 28 by one or more transmission lines such as transmission line 26. Transmission line 26 may be formed from a coaxial cable, from microstrip or stripline transmission line traces on a printed circuit board or other dielectric substrates, or from other transmission line structures. As shown in FIG. 2, transmission line 24 may include a positive conductor such as conductor 22 and a ground conductor such as conductor 24. Paths 22 and 24 may be formed from metal traces, wires, strips of metal, portions of conductive housing structures in device 10 such as housing 12, or other conductive structures in device 10.

Radio-frequency transceiver circuitry 28 may include cellular telephone transceiver circuitry, circuitry for wireless local area network transceivers (e.g., IEEE 802.11 circuitry), Bluetooth® circuitry, satellite navigation system circuitry, or other radio-frequency transmitter and receiver circuitry.

Device 10 may also include other circuitry 30 such as processors, display drivers, application-specific integrated circuits, memory, and other circuitry. To prevent interference between circuits that generate radio-frequency signals and/or that are sensitive to interference from incoming radio-frequency signals, circuitry such as radio-frequency transceiver circuitry 28 (e.g., one or more transceiver integrated circuits) and/or other circuitry 30 may be provided with electromagnetic interference shielding structures such as electromagnetic interference shielding structures 32.

Structures such as antenna structures 20, shielding structures 32, and other metal structures in device 10 may be formed from dielectrics coated with metal. The dielectric material in these structures may serve as a supporting structure. Polyimide, polyethylene terephthalate (PET), liquid crystal polymers, or other polymers may be used to form dielectric supporting structures. Polyimide, polyethylene terephthalate, liquid crystal polymers, and other polymers may exhibit low loss tangents (i.e., small amounts of radio-frequency signal loss) and may be mechanically robust (e.g., these polymers may withstand damage at high temperatures). Polyimide, polyethylene terephthalate, liquid crystal polymers, and other polymers may also be readily workable (e.g., using heated molds) and may be formed into thin layers (e.g., layers of 0.2 mm or less in thickness, layers of 0.1 mm or less in thickness, layers of 0.02 to 0.2 mm in thickness, etc.).

Metal for coating the dielectric in structures 20, structures 32, or other metal coated dielectric structures in device 10 may include gold, copper, stainless steel, nickel, brass, other metals, or combinations of these metals. Patterned metals may be used to form antenna resonating element traces or metal for shielding cans. Metal may also be deposited as a blanket coating on a dielectric without extensive patterning.

Figure 3:
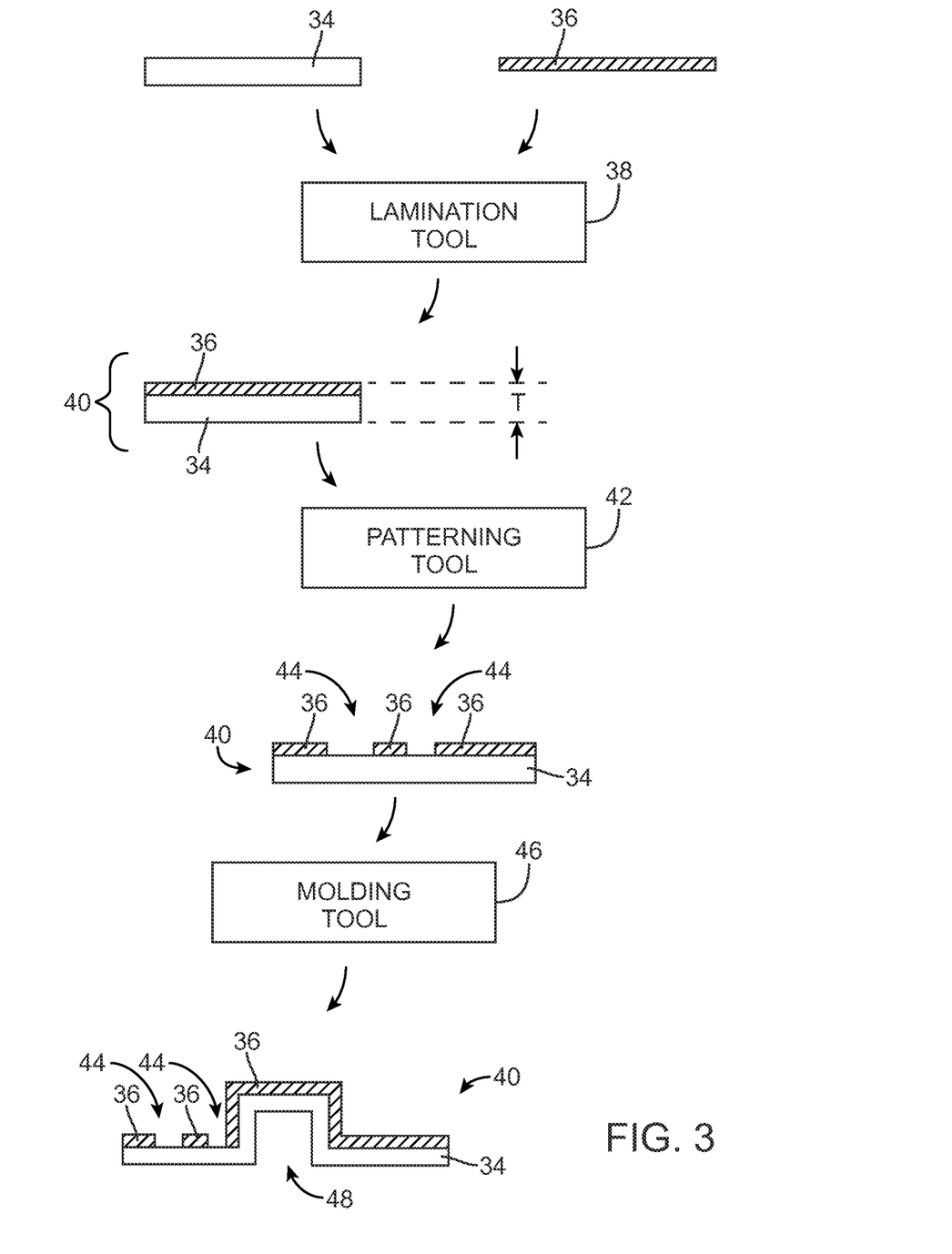
FIG. 3 is a diagram showing how a metal structure on a dielectric substrate may be formed by attaching metal to a dielectric structure and performing shaping operations on the dielectric and metal structure in accordance with an embodiment of the present invention.

FIG. 3 shows how metal structures such as shielding structures, antennas, or other metal structures may be formed for device 10.

As shown in FIG. 3, processing equipment such as lamination tool 38 may receive dielectric 34 and metal 36. Dielectric 34 may be a polymer or other suitable material. As an example, dielectric 34 may be a thermoplastic polymer that is characterized by a low loss tangent making dielectric 34 suitable for use in forming an antenna substrate. Dielectric 34 may also be formed from other polymeric materials. Examples of polymers that may be used in forming dielectric 34 include liquid crystal polymer, polyimide, and polyethylene terephthalate. Other types of polymer, glass, ceramic, other dielectrics, or combinations of these materials may be used in forming dielectric 34 if desired.

Dielectric 34 may have the shape of a block (e.g., a rectangular prism), a shaped non-rectangular solid, or a thin sheet (e.g., a sheet with a thickness of 0.2 mm or less, a substrate with a thickness of 0.1 mm or less, or a sheet with a thickness of 0.02 to 0.2 mm, as examples). Illustrative configurations for dielectric 34 in which dielectric 34 is based on a thin sheet of material are sometimes described herein as an example. Other types of shapes for dielectric 34 may be used if desired.

Metal 36 may be include copper, gold, nickel, stainless steel, brass, or other metals. Metal 36 may be formed from a thin metal sheet (e.g., metal foil with a thickness of 0.1 mm or less, 0.03 mm or less, 0.1 to 0.005 mm, etc.), may be formed from metal wire, may be formed from strips of metal or metal of other shapes, may be deposited as a coating (e.g., to form metal traces on a substrate), or may have other shapes. Metal 36 may include one type of metal, multiple types of metal (e.g., multiple metal layers), may be formed from a metal alloy, or may be formed from other metal structures.

Using a system arrangement of the type shown in FIG. 3, lamination tool 38 may laminate a sheet of metal such as metal sheet 36 onto a surface of dielectric 34 (e.g., the upper surface of a sheet of dielectric 34 and/or one or more other surfaces of dielectric 34). Resulting metal coated structures 40 may have a thickness T of 0.2 mm or less, 0.1 mm or less, 0.02 to 0.2 mm, or more than 0.02 mm). Heat, pressure, and/or adhesive and other attachment mechanisms may be used in attaching metal layer 36 to substrate layer 34.

Following use of lamination tool 38 to form dielectric structures coated with an unpatterned metal coating, patterning tool 42 may be used in forming metal structures 40 with patterned metal 36 (e.g., metal with openings such as openings 44). Patterning tool 42 may include laser etching equipment, dry or wet chemical etching equipment, machining equipment, or other equipment for patterning metal 36 on dielectric layer 34.

Molding tool 46 may be used to shape structures 40 into a desired shape following metal patterning. As shown in FIG. 3, for example, molding tool 46 may be used to heat and press structures 40 into a shape with recesses such as recess 48 (and a corresponding raised portion on the opposing side of structures 40). Structures with curved surfaces and complex features may be formed. The shape into which structures 40 are formed may be used to form an electromagnetic interference shield, antenna structures, or other metal coated dielectric structures for device 10.

Figure 4:
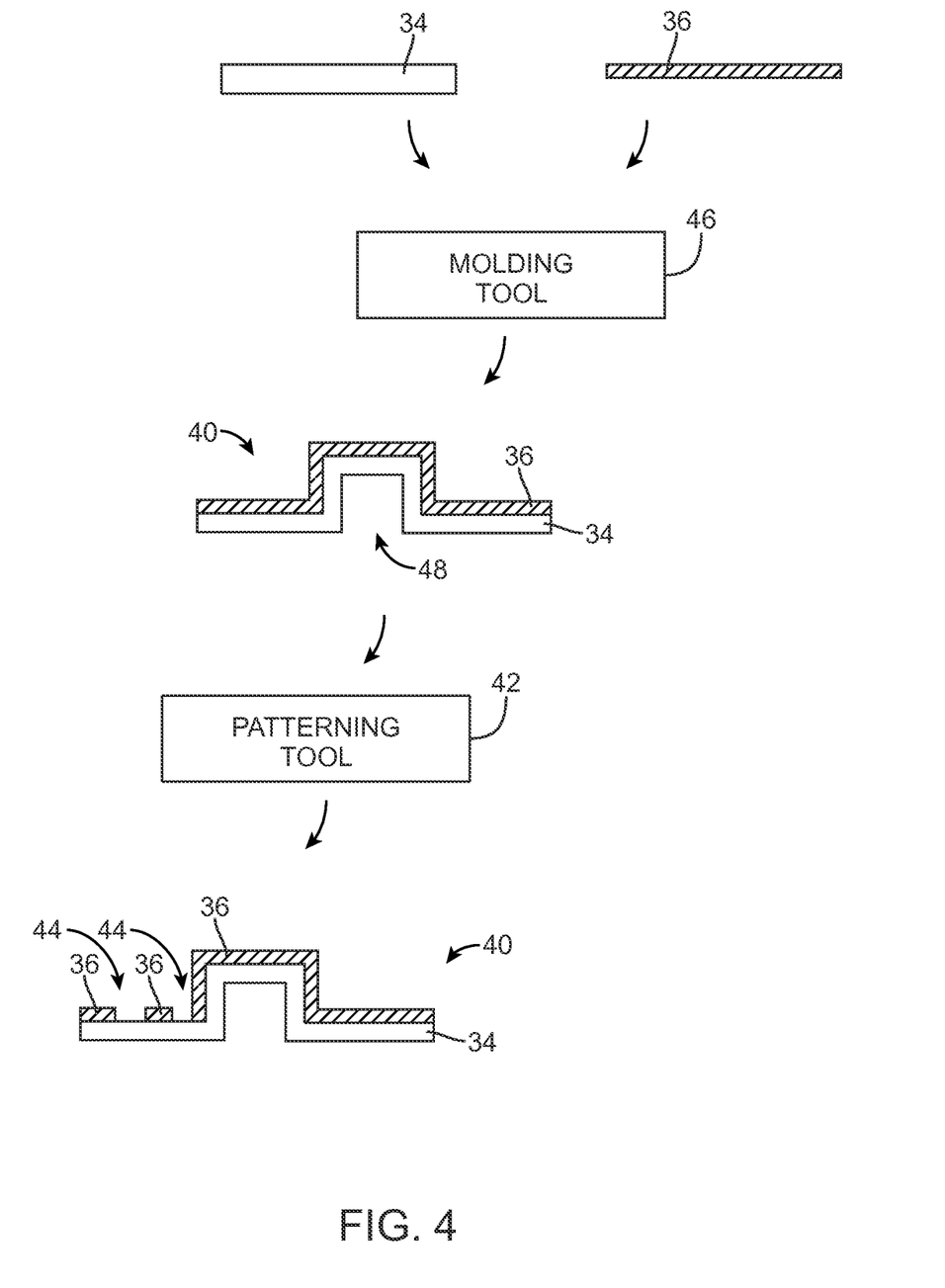
FIG. 4 is a diagram showing how a metal structure on a dielectric substrate may be formed by molding metal and dielectric material in accordance with an embodiment of the present invention.

In the illustrative configuration of FIG. 4, dielectric 34 and metal 36 may be shaped together to form shaped metal coated dielectric structures 40 (e.g., structures 40 that include raised features and depressions such as recess 48). Following shaping of structures 40, patterning tool 42 may be used to pattern metal coating layer 36 (e.g., to form openings 44).

Figure 5:
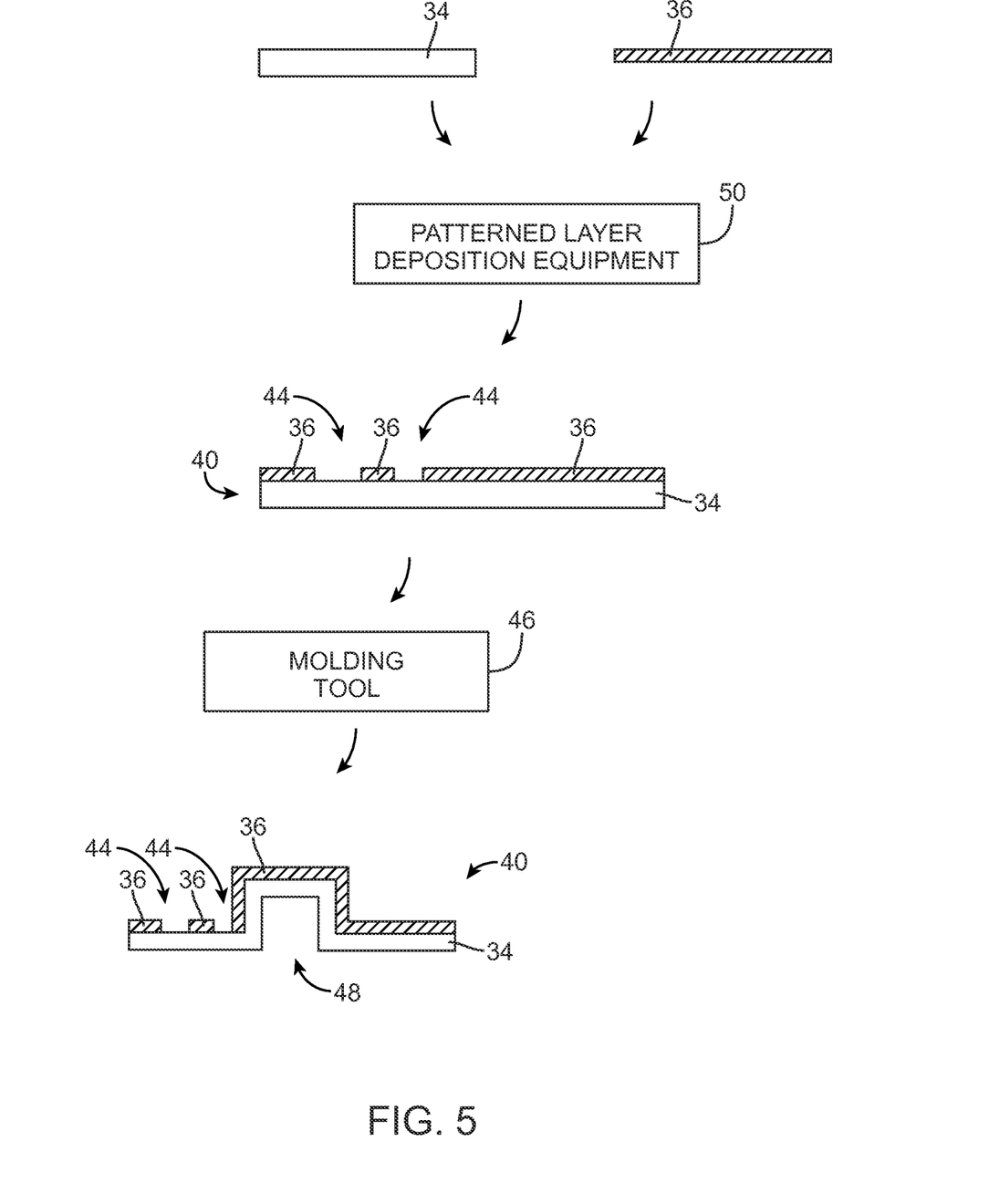
FIG. 5 is a diagram showing how a metal structure on a dielectric substrate may be formed by patterning metal onto a dielectric substrate and shaping the metal and dielectric in accordance with an embodiment of the present invention.

If desired, metal 36 may be deposited and patterned onto dielectric 36 using patterned layer deposition equipment 50, as shown in FIG. 5. Equipment 50 may pattern metal 36 while metal 36 is being deposited on layer 34. For example, metal 50 may include a shadow mask and physical vapor deposition equipment that deposits metal 50 onto dielectric layer 34 through the shadow mask or may include equipment for laminating pattered metal foil onto dielectric layer 34. As another example, metal 50 may be deposited using an ink-jet printer, by spraying or spinning metal paint onto layer 34, or by patterning metal paint or other conductive material onto layer 34 using pad printing, screen printing, dripping, or other deposition and patterning techniques.

Following the formation of patterned metal 36 on dielectric 34 to form metal coated structures 40, equipment such as molding tool 46 may be used to shape metal coated dielectric structures 40 into a desired shape (e.g., a shape having raised portions and depressed portions such as recess 48). Molding equipment 46 may include a metal die having a shape that is matched to a desired end shape for structures 40 and heating equipment that heats the metal die. The heated die may, through application of heat and pressure, cause dielectric 34 (and thin metal coating 36) to assume a desired end shape, such as the shape of FIG. 5 that includes recess 48.

Figure 6:
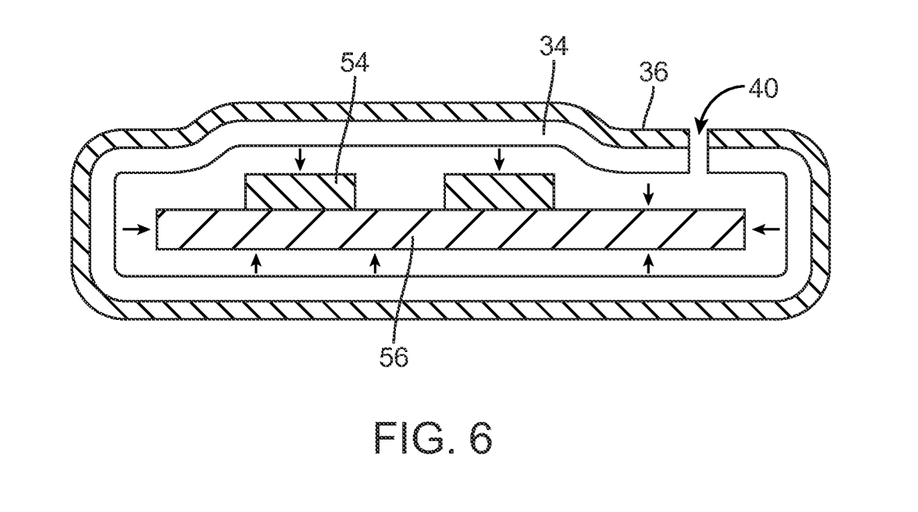
FIG. 6 is a cross-sectional side view of a system with components such as integrated circuits mounted on a printed circuit board that has been surrounded by a layer of dielectric coated with metal in accordance with an embodiment of the present invention.

FIG. 6 shows how components such as integrated circuits 54 in device 10 may be mounted on a substrate such as printed circuit 56. Printed circuit 56 may be a rigid printed circuit board (e.g., a printed circuit board formed from a substrate material such as fiberglass-filled epoxy) or may be a flexible printed circuit (e.g., a printed circuit formed from patterned metal traces on a flexible substrate such as a layer of polyimide or a flexible sheet of other polymers). Integrated circuits 54 may include radio-frequency transceiver circuitry such as circuitry 28 of FIG. 2 and other circuitry 30.

Metal coated dielectric sheet 40 may be formed from a layer of metal such as metal 36 on a flexible dielectric sheet such as sheet 34. Metal 36 may be a layer of copper or other metal. Dielectric sheet 34 may be a sheet of liquid crystal polymer or other flexible polymer material (as examples). Metal coated dielectric sheet 40 may be wrapped around circuitry such as integrated circuits 54 on printed circuit 56 as shown in FIG. 6. Sheet 40 may have ends that overlap or that join along a seam or may be formed from a tube of material that slides over integrated circuits 54 and printed circuit 56. Metallized structures 40 may be used in a shape of the type shown in FIG. 6 that surrounds circuitry such as circuits 54 and printed circuit 56 to serve as an electromagnetic interference shield, antenna structures, or other metallized dielectric structures. Structures 40 may also be shaped further before use in device 10, if desired.

Figure 7:
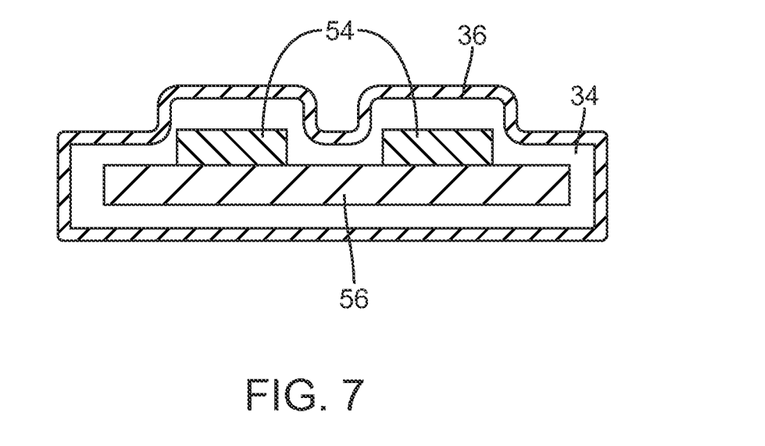
FIG. 7 is a cross-sectional side view of the structures of FIG. 6 following the formation of an electromagnetic shield using the layer of dielectric coated with metal in accordance with an embodiment of the present invention.

As shown in FIG. 7, for example, metal coated dielectric sheet 40 may be shaped to conform to the surfaces of components such as integrated circuits 54 and printed circuit 56 or other internal device structures. Metal coated dielectric sheet 40 may, for example, be caused to shrink and otherwise conform to circuits 54 and printed circuit 56 by applying heat in an oven or other heat application equipment (as with heat-shrink plastic), using a vacuum (e.g., in a vacuum lamination tool), using pressure (e.g., in a mold or press), etc. By conforming metal coated dielectric sheet 40 to the outer surfaces of integrated circuits 54 and printed circuit 56 (or other device structures), metal coated dielectric sheet 40 may serve as an electromagnetic interference shield (i.e., a compact potentially thin-walled shielding can). If desired, metal 36 of FIG. 7 may be patterned to form antenna traces for antenna structures such as antenna structures 20 of FIG. 2 or other metal structures in device 10.

Figure 8:
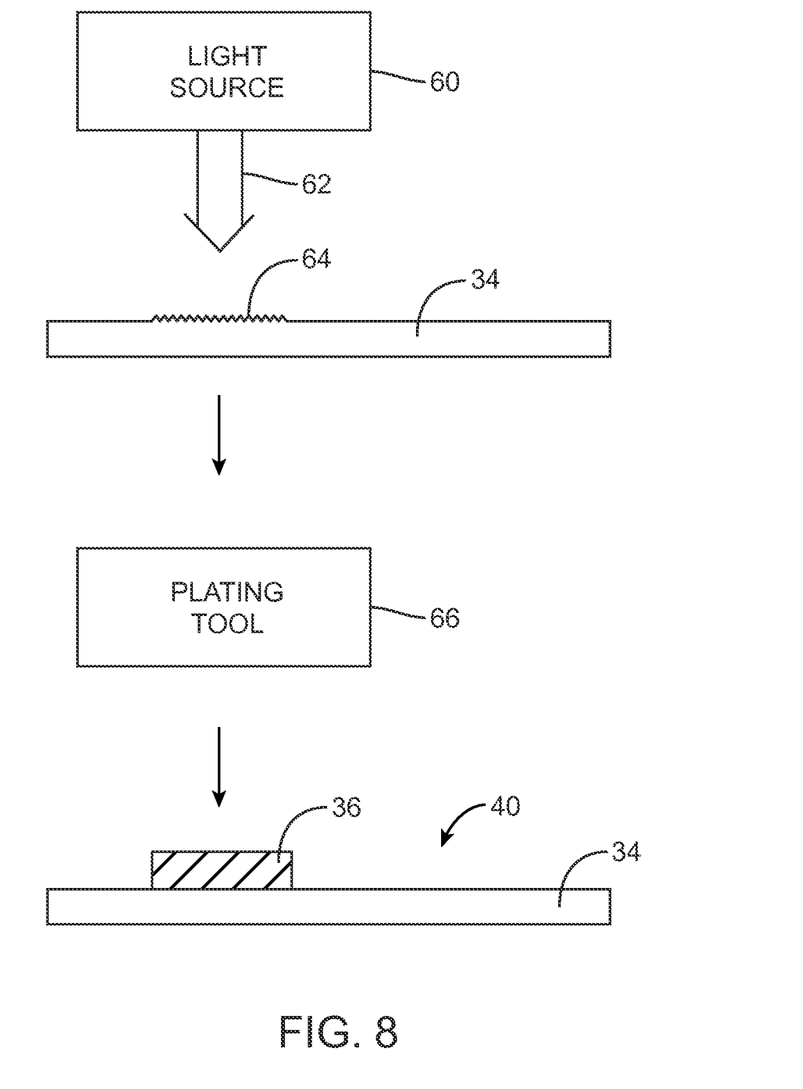
FIG. 8 is a diagram of a system in which a surface modification tool such as a light source is being used to activate a portion of a dielectric surface so that the activated portion of the dielectric surface may be selectively coated with metal in accordance with an embodiment of the present invention.

Metal 36 may be patterned using techniques that selectively activate portions of the surface of dielectric 34 for subsequent metal electroplating. As shown in FIG. 8, for example, a laser or other light source 60 may produce light beam 62. Light beam 62 (or mechanical roughening equipment) may be used to create a region such as region 64 on the surface of dielectric 34 that is activated relative to the remaining (unactivated) portions of dielectric 34. Plating tool 66 or other metal deposition equipment may be used to deposit metal 36 on the surface of dielectric 34 (e.g., using electrochemical deposition techniques such as plating techniques for electroplating metals such as copper, gold, nickel, etc. or using other electroplating techniques). During plating operations with tool 66, metal 36 will only be deposited in the patterned regions 64 that were activated using surface activation equipment such as light source 60, thereby creating patterned metal 36 in metal-coated dielectric structures 40. Molding techniques or other shaping techniques may then be used to form radio-frequency shielding structures, antenna structures, or other metal coated dielectric structures for device 10. If desired, patterned metal deposition techniques of the type shown in FIG. 8 may be formed after dielectric 34 has been shaped to a desired shape (e.g., after molding dielectric 34 into a shape with protrusions and depressions, after conforming dielectric 34 to the surface of integrated circuits or other components, etc.).

Figure 9:
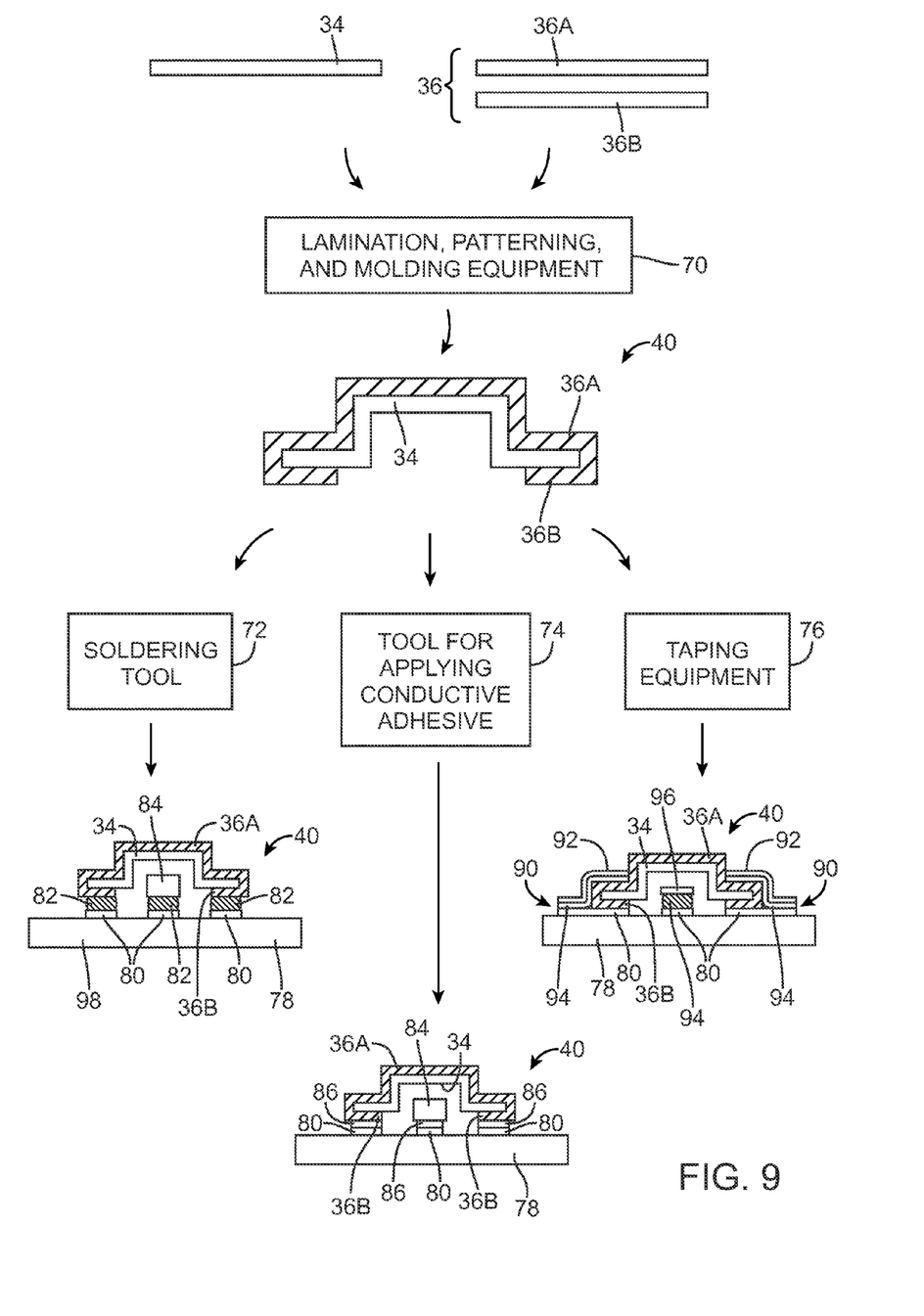
FIG. 9 is a diagram of a system in which a sheet of polymer or other dielectric has been formed with metal coatings on opposing first and second surfaces and has been mounted to a substrate using conductive structures in accordance with an embodiment of the present invention.

If desired, dielectric 34 may be coated with metal on opposing surfaces. FIG. 9 is a diagram of a system of the type that may be used in forming metal-coated dielectric structures that include metal coatings on both sides of a sheet of dielectric.

As shown in FIG. 9, processing equipment such as lamination, patterning and molding equipment 70 may receive dielectric 34 and metal 36. Dielectric 34 may be a polymer or other suitable material. As an example, dielectric 34 may be a thermoplastic polymer that is characterized by a low loss tangent. Dielectric 34 may have the shape of a block (e.g., a rectangular prism), a shaped non-rectangular solid, or a thin sheet (e.g., a sheet with a thickness of 0.2 mm or less, a substrate with a thickness of 0.1 mm or less, or a sheet with a thickness of 0.02 to 0.2 mm, as examples).

Metal 36 may include one or more layers of metal such as layers 36A and 36B. Metal 36 may be copper, gold, nickel, stainless steel, brass, or other metals. Metal 36 may be formed from one or more thin metal sheets (e.g., metal foil with a thickness of 0.1 mm or less, 0.03 mm or less, 0.1 to 0.005 mm, etc.), may be formed from metal wire, may be formed from strips of metal or metal of other shapes, may be deposited as a coating (e.g., to form metal traces on a substrate), or may have other shapes. Metal 36 may include one type of metal, multiple types of metal (e.g., multiple metal layers), may be formed from a metal alloy, or may be formed from other metal structures.

Lamination equipment in equipment 70 may be used to laminate metal 36 to dielectric 34 before or after patterning using patterning equipment in equipment 70. As an example, metal sheet 36A may be laminated to an upper surface of dielectric 34 and metal sheet 36B may be laminated to an opposing lower surface of dielectric 34. Patterning equipment may then be used to pattern the layers of metal 36 that have been formed on the surfaces of dielectric 34. As another example, patterning equipment (e.g., stamping equipment, etc.) may be used to pattern metal 36 before attaching the patterned metal to dielectric 34. Metal 36 may be attached to dielectric 34 using heat and/or adhesive. Molding equipment in equipment 70 may be used to mold dielectric 34 and metal 36 after attachment of patterned metal 36 to dielectric 34 or before patterning metal 36 on the surfaces of dielectric 34. Metal 36 may also be formed on the surface of dielectric 34 as part of a molding process (if desired).

Following formation of metal-coated dielectric structures 40 of FIG. 9, metal-coated dielectric structures 40 may have an upper metal coated surface such as metal layer 36A and may have a lower metal coated surface such as metal layer 36B. Structures 36A and 36B may form a metal electromagnetic signal shielding structure, antenna structures, contact pads, etc.

Metal-coated dielectric structures 40 may be mounted on a substrate such as substrate 78. Substrate 78 may be a piece of dielectric such as a block of plastic or may be a sheet of dielectric such as a rigid or flexible printed circuit substrate.

Soldering tool 72 may be used to solder metal-coated dielectric structures 40 to substrate 98. As shown on the lower left of FIG. 9, solder 82 may be used to attach lower surface metal coating 36B on metal-coated dielectric structures 40 to substrate 78. Upper surface metal coating 36A may be an integral part of lower surface metal coating 36B (i.e., metal coating 36A may extend continuously around the edges of dielectric 34) or may be attached to dielectric 34 as a separate layer. With one illustrative embodiment, metal 36A and/or 36B is used in forming an electromagnetic signal shield.

Substrate 78 may have contact pads such as contact pads 80. Pads 80 may be electrically connected to patterned conductive material on substrate 78 such as patterned interconnect lines, ground plane structures, and other conductive structures.

Dielectric 34 may have a shape with a cavity that receives one or more components such as component 84. Component 84 may be, for example, an integrated circuit. Component 84 may be mounted on substrate 78 using solder 82 and contact pads 80. Metal-coated dielectric structures 40 may serve as a shield for components such as component 84.

As shown on the lower center of FIG. 9, conductive adhesive 86 may be used to attach lower surface metal coating 36B on metal-coated dielectric structures 40 to substrate 78. Conductive adhesive 86 may be a liquid conductive adhesive or a conductive pressure sensitive adhesive (as examples). Tool 74 may be used in mounting structures to substrate 78 using adhesive 86.

Substrate 78 may have contact pads such as contact pads 80 that are electrically connected to interconnects and other conductive structures in substrate 78. Components such as component 84 may be mounted on one or more contact pads 80 using solder, conductive adhesive 86 (as shown in FIG. 9), or other conductive material. Dielectric 34 may be shaped to form a cavity that accommodates components such as component 84.

If desired, conductive tape may be used in mounting metal-coated dielectric structures 40 to substrate 78. Tape 90 may be applied using taping equipment 76. As shown in the lower right-hand corner of FIG. 9, tape 90 may include a conductive layer such a conductive backing layer 92 and an adhesive layer such as adhesive 94. Adhesive 94 may be a conductive adhesive. Backing layer 92 may be formed from metal foil or a conductive fabric (e.g., a fabric formed from metal fibers or metal coated plastic fibers).

Metal-coated dielectric structures 40 may have a cavity that accommodates one or more components such as component 96. Component 96 may be mounted to pads such as pad 80 on substrate 78 using conductive material 94 (e.g., conductive adhesive, solder, etc.). Metal-coated dielectric structures 40 may have metal such as upper metal layer 36A on the top surface of dielectric layer 34 and lower metal layer 36B on the opposing lower surface of dielectric layer 34. Layers 36A and 36B may be electrically isolated from each other or may be shorted to each other. Using conductive tape 90, metal on dielectric 34 (e.g., metal layer 36A and/or 36B) may be electrically connected to pads 80. Tape 90 may also help hold metal-coated dielectric structures 40 in place on substrate 78.

Figure 10:
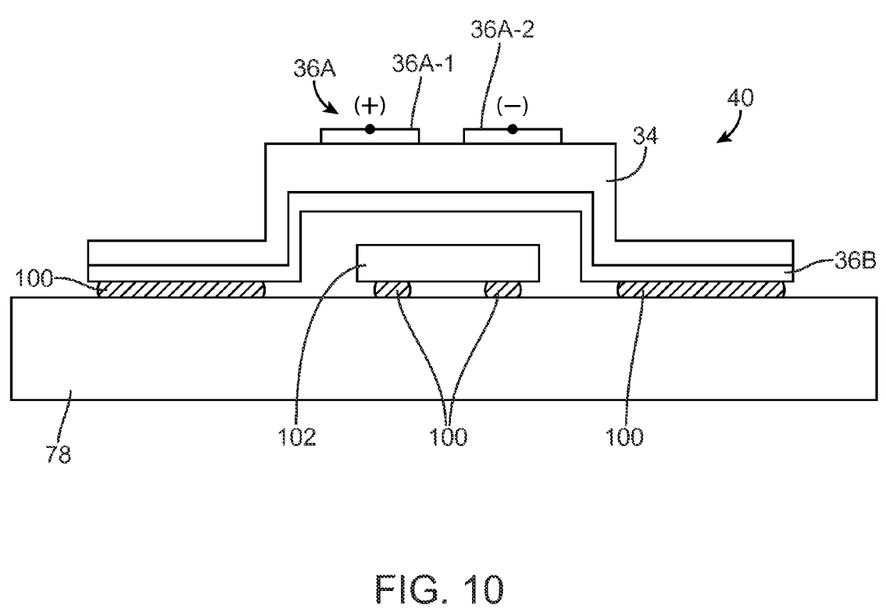
FIG. 10 is a cross-sectional side view of an illustrative polymer sheet coated on one surface with patterned metal to form structures such as antenna structures and coated on an opposing surface with metal to form structures such as shielding structures in accordance with an embodiment of the present invention.

FIG. 10 is a cross-sectional side view of metal-coated dielectric structures in an illustrative configuration in which upper metal layer 36A has been patterned to form an antenna. In particular, metal layer 36A on the outer surface of dielectric 34 has been patterned to form antenna structures 36A-1 and 36A-2.

Structures 36A-1 and 36A-2 may include antenna ground structures, parasitic antenna structures, antenna resonating element structures based on inverted-F antennas, patch antennas, planar inverted-F antennas, loop antennas, and other types of antennas, and other antenna structures. As an example, structures 36A-1 may form an antenna resonating element that is coupled to transmission line path 22 of transmission line 26 (FIG. 2) and structures 36A-2 may form an antenna ground that is coupled to transmission line path 24 of transmission line 26 (FIG. 2).

Dielectric 34 may serve to isolate antenna structures 36A from metal layer 36B on the lower surface of dielectric 34. Metal layer 36B may form a shielding layer or other conductive structures and may be electrically connected to contact pads on substrate 78 using conductive material 100 such as solder or conductive adhesive.

The shape of dielectric 34 may be configured to form a cavity that accommodates one or more components such as component 102. Conductive material 100 such as solder or conductive adhesive may be used to mount components such as component 102 to contact pads on substrate 78.

If desired, dielectric 34 of FIGS. 9 and 10 may conform to the shape of the components that are mounted under dielectric 34 (e.g., by applying heat to allow dielectric 34 to deform).

Figure 11:
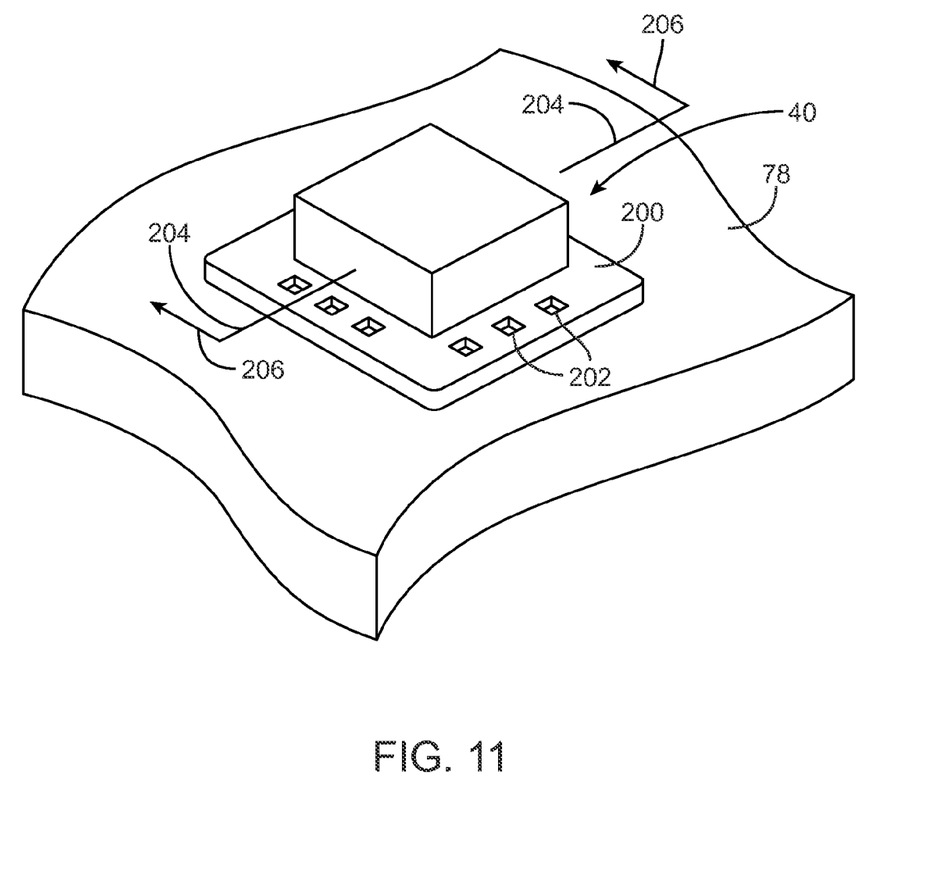
FIG. 11 is a perspective view of an illustrative shielding can mounted to a printed circuit substrate in a configuration in which the shielding can has peripheral openings to facilitate the formation of electrical connections to contacts on the printed circuit substrate in connection with an embodiment of the present invention.

A perspective view of an illustrative shielding can formed from metal-coated dielectric structures mounted to a substrate is shown in FIG. 11. As shown in FIG. 11, metal-coated dielectric structures 40 may have a shape that serves to cover and shield one or more electrical components mounted on substrate 78. Metal may be formed on the upper (outer) surface of the dielectric in structures 40, on the lower (inner)

surface of the dielectric in structures 40, or on both the upper and lower surface of the dielectric in structures 40. Substrate 78 may be a piece of dielectric such as a block of plastic or may be a sheet of dielectric such as a rigid or flexible printed circuit substrate. Peripheral lip portion 200 of metal-coated dielectric structures 40 may run around the edge of structures 40 and may have peripheral openings such as openings 202. Solder or other conductive material may be placed in openings 202 to mount metal-coated dielectric structures 40 to printed circuit board.

Figure 12:
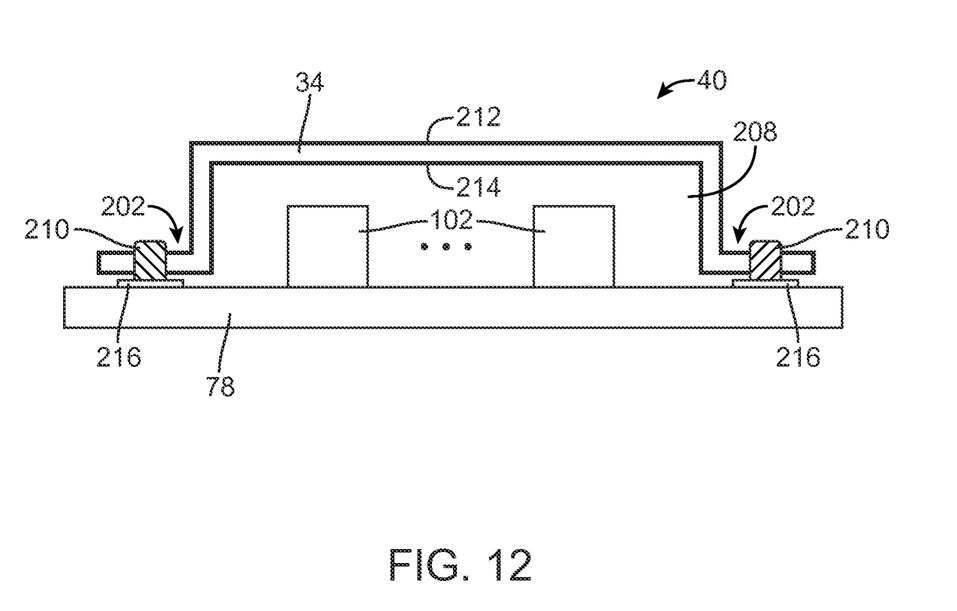
FIG. 12 is a cross-sectional side view of the shielding can of FIG. 11 showing how solder or other conductive material may protrude through the peripheral openings around the edge of the shielding can to help electrically connect the shielding can to traces on the printed circuit board in accordance with an embodiment of the present invention.

A cross-sectional side view of metal-coated dielectric structures 40 of FIG. 11 is shown in FIG. 12. The cross-sectional side view of FIG. 12 is taken along line 204 and viewed in direction 206 of FIG. 11. As shown in FIG. 12, metal-coated dielectric structures may have a shape that defines a cavity such as cavity 208. Electrical components 102 may be mounted on substrate 78 within cavity 208 (i.e., metal-coated dielectric structures 40 may serve as a radio-frequency shield).

Solder 210 may be placed in openings 202 to mount metal-coated dielectric structures 40 to metal traces in substrate 78 such as metal contact pads 216. Pads 216 may be, for example, ground structures that help ground metal-coated dielectric structures 40. Metal-coated dielectric structures 40 may have a dielectric layer such as dielectric layer 34 that is coated with an upper metal coating layer such as upper layer 212, a lower metal coating layer such as coating layer 214, or that is coated with both upper coating layer 212 and lower metal coating layer 214. Solder 210 may electrically connect (short) layers such as layer 212 and/or 214 to metal traces 216 (e.g., solder 210 may short the metal of metal-coated dielectric structures 40 to ground so that structures 40 may serve as a radio-frequency shield for components 102).

The foregoing is merely illustrative of the principles of this invention and various modifications can be made by those skilled in the art without departing from the scope and spirit of the invention. The foregoing embodiments may be implemented individually or in any combination.

What is claimed is:

1. A method of forming an electromagnetic interference shield to shield a component that has a shape, comprising:
   coating a polymer sheet with metal; and
   after coating the polymer sheet with metal, covering the component with the polymer sheet coated with the metal so that the polymer sheet conforms to the shape of the component.

2. The method defined in claim 1 wherein the polymer sheet comprises a thermoplastic polymer.

3. The method defined in claim 1 wherein covering the component comprises heating the polymer sheet.

4. The method defined in claim 1 wherein the component comprises an integrated circuit and wherein covering the component comprises covering the integrated circuit with the polymer sheet coated with the metal.

5. The method defined in claim 1 further comprising:
   patterning antenna structures on the polymer sheet.

6. The method defined in claim 1 wherein coating the polymer sheet with metal comprises:
   laminating a metal layer to the polymer sheet with a lamination tool; and
   after laminating the metal layer to the polymer sheet with the lamination tool and before covering the component with the polymer sheet coated with the metal, patterning the laminated metal layer with a patterning tool.

7. The method defined in claim 1 wherein coating the polymer sheet with metal comprises depositing patterned metal on the polymer sheet.

8. The method defined in claim 1 wherein coating the polymer sheet with metal comprises electroplating the metal.

9. The method defined in claim 1 wherein the polymer sheet has first and second opposing surfaces and wherein coating the polymer sheet with metal comprises forming metal structures on the first and second opposing surfaces.

10. The method defined in claim 1, wherein coating the polymer sheet with metal comprises coating the polymer sheet such that the metal is in direct contact with the polymer sheet.

11. A method of forming antenna structures, comprising:
    forming patterned metal structures on a dielectric layer; and
    after forming the patterned metal structures on the dielectric layer, molding the dielectric layer with the patterned metal traces into a shape having at least one recess.

12. The method defined in claim 11 wherein forming the patterned metal structures on the dielectric layer comprises:
    coating the dielectric layer with metal; and
    after coating the dielectric layer with metal, patterning the metal with a patterning tool.

13. The method defined in claim 11 wherein molding the dielectric layer comprises heating the dielectric layer with a molding tool.

14. The method defined in claim 11 wherein forming the patterned metal structures on the dielectric layer comprises forming the patterned metal structures on a thermoplastic polymer.

15. The method defined in claim 11 wherein the dielectric layer comprises a sheet of polymer having opposing first and second surfaces and wherein forming the patterned metal structures comprises forming metal structures on both the first and second surfaces.

16. A method of forming antenna structures, comprising:
    forming patterned metal structures on a dielectric layer; and
    molding the dielectric layer with the patterned metal traces into a shape having at least one recess, wherein the dielectric layer comprises a sheet of polymer having opposing first and second surfaces, wherein forming the patterned metal structures comprises forming metal structures on both the first and second surfaces, and wherein forming the metal structures on the first and second surfaces comprises forming antenna resonating element structures on the first surface and forming electromagnetic signal shielding structures on the second surface.

17. The method defined in claim 11, wherein forming patterned metal structures on a dielectric layer comprises forming the patterned metal structures in direct contact with the dielectric layer.

* * * * *